(12) United States Patent
Okura

(10) Patent No.: US 9,627,597 B2
(45) Date of Patent: Apr. 18, 2017

(54) PACKAGE, LIGHT-EMITTING DEVICE, AND METHOD FOR MANUFACTURING THE SAME

(71) Applicant: NICHIA CORPORATION, Anan-shi, Tokushima (JP)

(72) Inventor: Shinya Okura, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/978,391

(22) Filed: Dec. 22, 2015

(65) Prior Publication Data

US 2016/0190412 A1 Jun. 30, 2016

(30) Foreign Application Priority Data

Dec. 26, 2014 (JP) ................................ 2014-265783

(51) Int. Cl.
| | | |
|---|---|---|
| *H01L 33/00* | (2010.01) | |
| *H01L 33/62* | (2010.01) | |
| *H01L 33/60* | (2010.01) | |
| *H01L 33/48* | (2010.01) | |
| *H01L 21/48* | (2006.01) | |
| *H01L 23/495* | (2006.01) | |
| *H01L 23/00* | (2006.01) | |
| *H01L 21/56* | (2006.01) | |

(52) U.S. Cl.
CPC .......... *H01L 33/62* (2013.01); *H01L 21/4846* (2013.01); *H01L 23/49562* (2013.01); *H01L 24/97* (2013.01); *H01L 33/486* (2013.01); *H01L 33/60* (2013.01); *H01L 21/565* (2013.01); *H01L 2224/48091* (2013.01); *H01L 2224/48247* (2013.01); *H01L 2224/48257* (2013.01); *H01L 2924/0002* (2013.01); *H01L 2933/0033* (2013.01); *H01L 2933/0066* (2013.01)

(58) Field of Classification Search
CPC .......................... H01L 33/62; H01L 23/49562
USPC ............................................. 257/98
See application file for complete search history.

(56) References Cited

U.S. PATENT DOCUMENTS

| | | |
|---|---|---|
| 2011/0193112 A1 | 8/2011 | Inoue et al. |
| 2013/0005210 A1 | 1/2013 | Takeda et al. |
| 2013/0221509 A1 | 8/2013 | Oda et al. |

(Continued)

FOREIGN PATENT DOCUMENTS

| | | |
|---|---|---|
| JP | 11-340378 A | 12/1999 |
| JP | 2004-253711 A | 9/2004 |
| JP | 2011-165833 A | 8/2011 |

(Continued)

*Primary Examiner* — Anthony Ho
(74) *Attorney, Agent, or Firm* — Squire Patton Boggs (US) LLP

(57) ABSTRACT

A package includes a plurality of electrode pairs, each electrode pair including a first electrode on one side and a second electrode on another side in a plan view. The first electrode is electrically connected to the second electrode included in an electrode pair adjacent to a first or second lateral side of the one electrode pair, and is not electrically connected to the first electrode included in the electrode pair adjacent to the first or second side of the one electrode pair. The second electrode is electrically connected to the first electrode included in an electrode pair adjacent to a lower side of the one electrode pair, and is not electrically connected to the second electrode included in the electrode pair adjacent to the first or second lateral side of the one electrode pair.

7 Claims, 5 Drawing Sheets

(56) References Cited

U.S. PATENT DOCUMENTS

2014/0054629 A1    2/2014  Kim

FOREIGN PATENT DOCUMENTS

| JP | 2012-114278 A | 6/2012 |
|----|---------------|--------|
| JP | 2012-191233 A | 10/2012 |
| JP | 2012-243788 A | 12/2012 |
| JP | 2013-012666 A | 1/2013 |
| JP | 2013-168653 A | 8/2013 |
| JP | 2013-171969 A | 9/2013 |
| JP | 2013-232590 A | 11/2013 |
| JP | 2013-232592 A | 11/2013 |
| JP | 2014-042011 A | 3/2014 |

PACKAGE, LIGHT-EMITTING DEVICE, AND METHOD FOR MANUFACTURING THE SAME

CROSS-REFERENCE TO RELATED APPLICATIONS

This application claims priority on Japanese Patent Application No. 2014-265783 filed on Dec. 26, 2014, the disclosure of which is incorporated by reference herein.

BACKGROUND

Technical Field

Embodiments of the present invention relate to a package, a light-emitting device using the package and a light-emitting element, and a method for manufacturing the same.

Description of Related Art

A lead frame is used in a light-emitting device to mount thereon a light-emitting element such as a light-emitting diode (LED). The lead frame includes a plurality of electrode pairs, with each electrode pair serving as a positive electrode and a negative electrode and including a die pad and a lead part. The plurality of electrode pairs is arranged in parallel in a plurality of rows and a plurality of columns (see, for example, JP 2013-168653 A and JP 2013-232590 A). For the purpose of reducing deformation of such a lead frame in handling, a lead frame for mounting a semiconductor element has been proposed in which the adjacent electrode pairs are coupled together via a plurality of reinforcing pieces each protruding from the corresponding die pad or lead.

A light emitting device typically includes a package and a light emitting element. The package includes a lead frame and a molded body that covers a portion of an upper surface, a portion of a lower surface, and an end surface of the electrode pairs of the lead frame. The light emitting element is connected to the lead frame. Specifically, an LED package is proposed that can precisely control the light distribution characteristics (see, for example, JP 2013-171969 A). The LED package includes a light transmissive member disposed in a part covering a region over the light-emitting element and allowing the light emitted from the light-emitting element to pass therethrough and a light reflective member disposed on a lateral side of the transmissive member and allowing for reflecting the light emitted from the light-emitting element (see, for example, JP 2013-171969 A).

In manufacturing the light-emitting device using such a lead frame that includes the adjacent electrode pairs coupled together by the reinforcing pieces, the lead frame is fixed with the molded body made of resin or the like to form the package, and the light-emitting elements are mounted in the package. Then, the package is singulated by dicing or the like in such a way as to cut the reinforcing piece between the electrode pairs, thus producing a plurality of individual light-emitting devices.

The light-emitting devices manufactured in this way are mounted in parallel on a mounting substrate, for example, by soldering. In this case, the adjacent singulated packages might come into contact with each other because of displacement from their respective mounting positions due to poor soldering, which may lead to breakage of the light-emitting devices at an early stage. For this reason, the adjacent light-emitting devices need to be mounted with a certain spacing therebetween. Thus, the plurality of light-emitting devices may not be arranged at a high mounting density.

SUMMARY

Accordingly, it is an object of an embodiment of the present invention to provide a package in which a plurality of sets of light-emitting elements are arranged at a high mounting density, a light-emitting device using such a package, and a method for manufacturing the same.

A package according to one aspect of the present invention includes a plurality of electrode pairs, each electrode pair including a first electrode on an upper longitudinal side and a second electrode on a lower longitudinal side in a plan view, the plurality of electrode pairs arranged in a row and a column. The first electrode of at least one of the plurality of electrode pairs is electrically connected to the second electrode included in an electrode pair adjacent to a first side or a second lateral side of the one electrode pair, and the second electrode of at least one of the plurality of electrode pairs is electrically connected to the first electrode included in an electrode pair adjacent to a lower side of the one electrode pair. In the package, the first electrode of the at least one electrode pair is not electrically connected to the first electrode included in the electrode pair adjacent to the first or second lateral side of the one electrode pair, while the second electrode of the at least one electrode pair is not electrically connected to the second electrode included in the electrode pair adjacent to the first or the second lateral sides of the one electrode pair, and the first electrode and the second electrode of the at least one electrode pair are fixed with a molded body, and the molded body has substantially a rectangular outer shape.

A light-emitting device according to another aspect of the present invention includes a package including a plurality of electrode pairs, each electrode pair including a first electrode on an upper longitudinal side and a second electrode on a lower longitudinal side in a plan view, the plurality of electrode pairs arranged in a row and a column. A light-emitting element is mounted on the first electrode of the at least one electrode pair or on the second electrode of the at least one electrode pair. The first electrode of at least one of the plurality of electrode pairs is electrically connected to the second electrode included in an electrode pair adjacent to a first lateral side or a second lateral side of the one electrode pair. The second electrode of at least one of the plurality of electrode pairs is electrically connected to the first electrode included in an electrode pair adjacent to a lower longitudinal side of the one electrode pair. In the package, the first electrode of the at least one electrode pair is not electrically connected to the first electrode included in the electrode pair adjacent to the first lateral side or the second lateral side of the one electrode pair; the second electrode of the at least one electrode pair is not electrically connected to the second electrode included in the electrode pair adjacent to the first lateral side or the second lateral side of the one electrode pair. The first electrode and the second electrode of the at least one electrode pair are fixed with a molded body, and the molded body has substantially a rectangular outer shape.

Therefore, embodiments of the present invention can provide a package capable of mounting light-emitting elements at a high packaging density, as well as a light-emitting device using the package.

DETAILED DESCRIPTION

Figure 1:
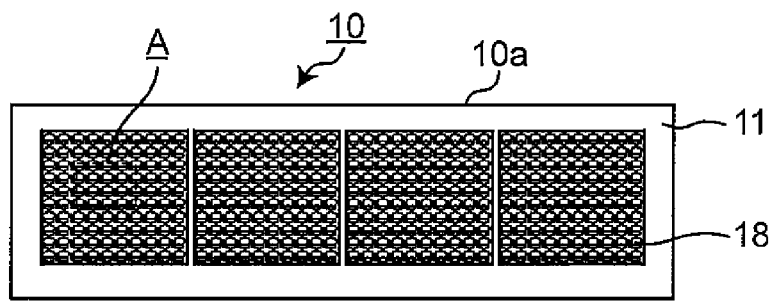
FIG. 1 is a schematic plan view showing a lead frame according to a first embodiment of the present invention.

In a conventional lead frame in which adjacent electrode pairs are connected together via a plurality of reinforcing pieces, these reinforcing pieces are only intended to reinforce a lead frame. If electricity is supplied to a light-emitting device using the lead frame with such reinforcing pieces for connecting the electrode pairs, a short circuit might occur, causing the light-emitting device to be burned out. For this reason, in the conventional manufacturing method for the light-emitting device using the lead frame, that the package is usually singulated by dicing or the like for each electrode pair, and then the reinforcing pieces between the adjacent electrode pairs are removed.

On the other hand, in a light-emitting device according to the embodiment of the present invention, adjacent electrode pairs are connected together in the lead frame in such a manner as to configure a circuit for electrically connecting the electrode pairs in series via the reinforcing pieces. Accordingly, the entire lead frame configures the circuit for electrically connecting the electrode pairs in series, while enhancing the strength of the lead frame itself. Here, in a plan view, one electrode pair consisting of a first electrode on the upper side and a second electrode on the lower side is replaced with a part of the lead frame, as an example.

That is, as will be described in detail below, in the light-emitting device using the lead frame in which the circuit is formed to electrically connect the adjacent electrode pairs in series, a short circuit does not occur even when an electricity is supplied to the light-emitting device. Thus, the necessity of singulation of the package for each individual electrode pair can be reduced, so that the light-emitting devices can be mounted at a high mounting density.

Embodiments of the present invention will be described in detail below with reference to the accompanying drawings. A light-emitting device described below is intended to embody the technical feature of the present invention and not to limit the scope of the present invention to the following embodiments unless otherwise specified. The contents mentioned in one embodiment can also be applied to other embodiments. In the description below, the terms indicative of the specific direction or position (for example, "upper", "lower", "right", "left", "longitudinal", "lateral", and other words including these words) are used for easy understanding of the present invention with reference to the figures as needed. The meanings of these terms are not intended to limit the technical range of the present invention. The same parts or members are designated by the same reference numerals throughout the drawings. In some drawings, the sizes or positional relationships of members, etc., are emphasized to clarify the description below.

Figure 2:
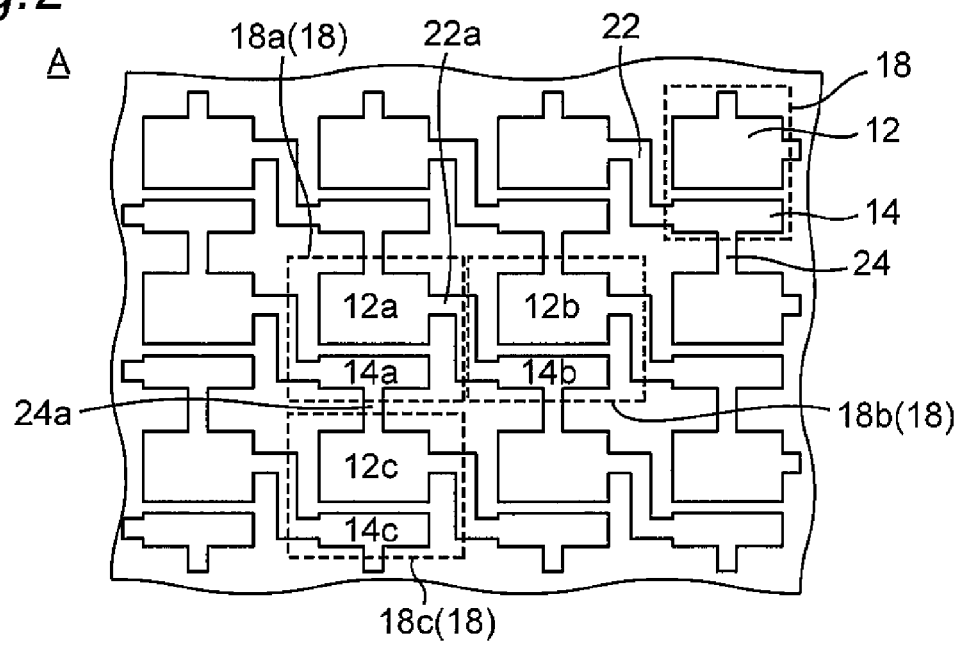
FIG. 2 is a schematic partially enlarged plan view (an enlarged view of an "A" part in FIG. 1) showing the lead frame in the first embodiment.

A light-emitting device according to a first embodiment of the present invention will be described below. FIG. 1 shows a schematic plan view showing an entire lead frame in the first embodiment. FIG. 2 shows a schematic partially enlarged plan view (an enlarged view of an "A" part in FIG. 1) of the lead frame in the first embodiment.

In a light-emitting device 1 and a package 2 according to the first embodiment, a lead frame 10 shown in FIGS. 1 and 2 can be used.

The lead frame 10 includes a frame region 11 having a peripheral edge 10a, and a plurality of electrode pairs 18 arranged in a plurality of rows and a plurality of columns in the frame region 11. One electrode pair 18 includes a first electrode 12 and a second electrode 14 disposed adjacent to the first electrode 12 (adjacent to the lower side of the first electrode 12 in the planar view of FIG. 2). The lead frame 10 used in the light-emitting device 1 and the package 2 includes a plurality of electrode pairs 18 with such an electrode pair 18 as one unit.

In the lead frame 10, at least one electrode pair 18 is electrically connected to adjacent electrode pairs 18 via a first wiring 22 extending from the first electrode 12 and a second wiring 24 extending from the second electrode 14. For example, one electrode pair 18a is connected to a second electrode 14b of an adjacent electrode pair 18b adjacent to the right side of the electrode pair 18a via a first wiring 22a extending from a first electrode 12a. The electrode pair 18a is connected to a first electrode 12c of an electrode pair 18c adjacent to the lower side of the electrode pair 18a via a second wiring 24a extending from a second electrode 14a. Likewise, for example, a first electrode 12b of the electrode pair 18b may be connected to the second electrode 14 of the electrode pair 18 adjacent to the right side of the electrode pair 18b via the first wiring 22 extending from the first electrode 12b, and connected to the first electrode 12 of the electrode pair 18 adjacent to the lower side of the electrode pair 18b via the second wiring 24 extending from the second electrode 14b of the electrode pair 18b.

In this way, not only the first electrode 12 of only one electrode pair 18, but also first electrodes 12 of a plurality of electrode pairs 18 may be electrically connected to the second electrode 14 of the electrode pair 18 adjacent to the right side or left side thereof. The second electrode 14 of one electrode pair 18 or second electrodes 14 of a plurality of the electrode pairs 18 may be electrically connected to the first electrode 12 included in the electrode pair 18 adjacent to the lower side of the one electrode pair 18.

Alternatively, in the lead frame 10, the first electrode 12 of the one electrode pair 18 may be connected not to the second electrode 14b of the electrode pair 18 adjacent to the right side of the one electrode pair 18, but to the second electrode 14b of the electrode pair 18 via the first wiring 22 adjacent to the left side of the one electrode.

In the lead frame 10, the shape of the first wiring 22 may be bent in a step-like manner, but not limited thereto.

Note that the term "left and right directions" as used in the present specification means the direction in which the first electrodes 12 (or second electrodes 14) are disposed adjacent to each other (that is, lateral direction). Further, the term "upper and lower directions" as used herein means the direction in which the first electrode 12 and the second electrode 14 are alternately disposed adjacent to each other (that is, longitudinal direction).

In the lead frame 10, in at least one set of adjacent electrode pairs 18, the adjacent first electrodes 12 are not electrically connected to each other. Furthermore, the adjacent second electrodes 14 are not electrically connected to each other between the adjacent electrode pairs 18.

Here, the expression "the adjacent first electrodes 12 are not electrically connected to each other between the adjacent electrode pairs 18" as used herein means that the adjacent first electrodes are not electrically connected directly via the first wiring 22 and/or the second wiring 24 between the adjacent electrode pairs 18, which does not include the relation of electric connection via the frame region 11 of the lead frame 10 or the relation of electric connection via other electrode pairs 18. Furthermore, the expression "the adjacent second electrodes 14 are not electrically connected to each other between the adjacent electrode pairs 18" as used herein have the same meaning as that.

For example, in the lead frame 10, the first electrode 12a included in the electrode pair 18a is not electrically connected to any of the first electrodes 12 of the electrode pairs 18 disposed adjacent to the upper, lower, left, and right sides of the electrode pair 18a directly via the first wiring 22 and/or the second wiring 24.

Furthermore, the second electrode 14a included in the electrode pair 18a is not electrically connected to any one of the second electrodes 14 of the electrode pairs 18 disposed adjacent to the upper, lower, left and right sides of the electrode pair 18a directly via the first wiring 22 and/or the second wiring 24.

Likewise, for example, the first electrode 12b in the electrode pair 18b may not be electrically connected to any of the first electrodes 12 of the electrode pairs 18 disposed adjacent to the upper, lower, left, and right sides of the electrode pair 18b directly via the first wiring 22 and/or the second wiring 24. Furthermore, the second electrode 14b in the electrode pair 18b may not be electrically connected to anyone of the second electrodes 14 of the electrode pairs 18 disposed adjacent to the upper, lower, left and right sides of the electrode pair 18b directly via the first wiring 22 and/or the second wiring 24.

In this way, not only the first electrode 12 of only one electrode pair 18, but also first electrodes 12 of a plurality of electrode pairs 18 may not be electrically connected to the first electrode 12 of the electrode pairs 18 adjacent to the upper, lower, left, and right sides thereof. The second electrode 14 of each of one or more electrode pairs 18 may not be connected to the second electrode 14 included in the electrode pairs 18 adjacent to the upper, lower, left and right sides thereof.

The first electrode 12, the second electrode 14, the first wiring 22 and the second wiring 24 may be arranged in this way. With this arrangement, the lead frame 10 is configured to form a circuit in which the adjacent electrode pairs 18 are electrically connected together in series. Accordingly, in the entire lead frame 10, the electrode pairs 18 form the series-connected circuit. The lead frame 10 serve to electrically connect the light-emitting element of the light-emitting device in this embodiment with the power source. For example, the lead frame 10 may be a wiring formed on a substrate, a ceramic material, or the like.

Figure 3:
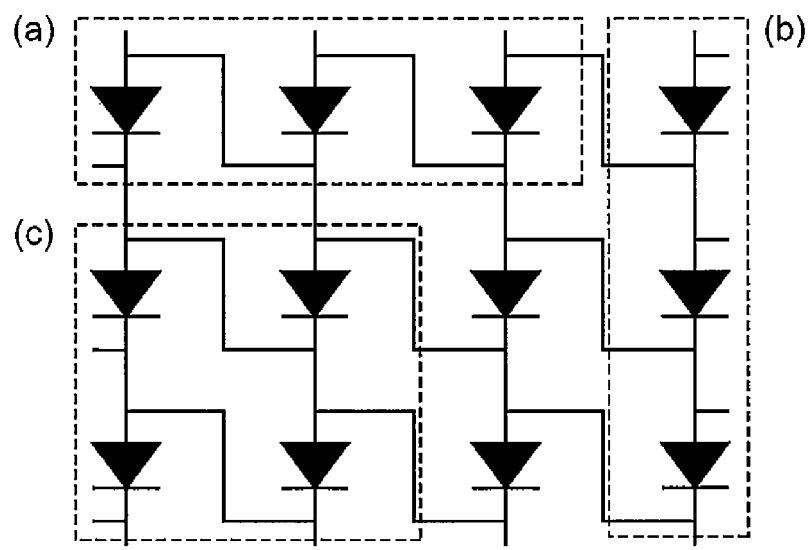
FIG. 3 is an equivalent circuit diagram of a light-emitting device in the first embodiment.

FIG. 3 shows an equivalent circuit diagram of the light-emitting device in the first embodiment. Specifically, FIG. 3 illustrates the equivalent circuit diagram of the light-emitting device 1 in which the light-emitting element, such as an LED, is mounted in the package 2 using the lead frame 10 shown in FIG. 2.

In the light-emitting device 1 of the first embodiment, one electrode pair 18 is connected in series to an adjacent electrode pair 18 to configure the circuit in which a short circuit does not occur as a whole.

The light-emitting device 1 can configure the electrically series-connected circuit in which a short circuit does not occur even after the circuit is singulated into any shape including a plurality of electrode pairs 18.

Note that the term "cingulate" as used in the present specification means "one package (or light-emitting device) is taken out (or cut out) from the whole of a plurality of sets of packages (or light-emitting devices)", or "some sets of packages (or light-emitting devices) are taken out (or cut out) from the whole of a plurality of sets of packages (or light-emitting devices)".

For example, as indicated by a dotted line (a) in FIG. 3, the singulation is performed to include a plurality of electrode pairs 18 in the lateral direction (i.e. in the embodiment shown in FIG. 2, in the direction in which the plurality of first electrodes 12 or the plurality of second electrodes 14 are arranged adjacent to each other). Even in this case, a circuit that is electrically series-connected via the plurality of first wirings 22 can be configured from the rightmost electrode pair 18 of the region defined by the dotted line (a) to the most leftward electrode pair 18 of the region defined by the dotted line (a).

For example, as indicated by a dotted line (b) in FIG. 3, the singulation is performed to include a plurality of electrode pairs 18 in the longitudinal direction (i.e. in the embodiment shown in FIG. 2, in the direction in which the first electrodes 12 and the second electrodes 14 are alternately arranged adjacent to each other). Even in this case, a circuit that is electrically series-connected via the plurality of second wirings 24 can be configured from the uppermost electrode pair 18 of the region defined by the dotted line (b) to the lowermost electrode pair 18 of the region defined by the dotted line (b).

Further, as indicated by a dotted line (c) in FIG. 3, the singulation is performed to include a plurality of electrode pairs 18 in the longitudinal and lateral directions. Even in this case, a circuit that is electrically series-connected via the first wirings 22 and the second wirings 24 can be configured from the most upperright electrode pair 18 of the region defined by the dotted line (c) to the most lower-leftward electrode pair 18 of the region defined by the dotted line (c).

Figure 4:
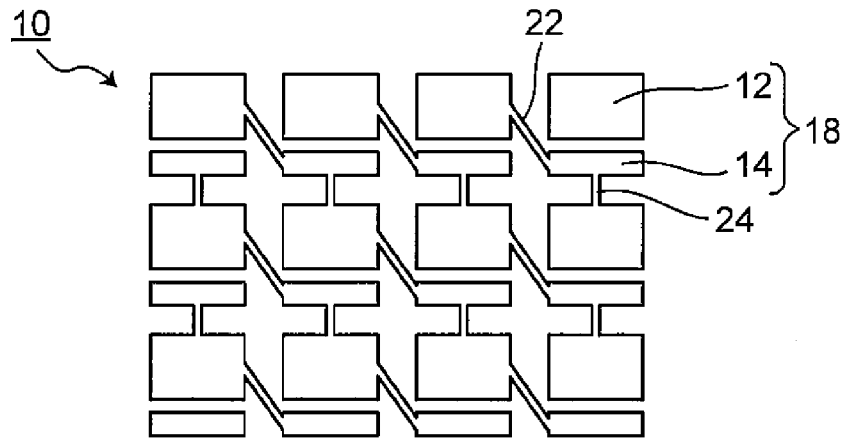
FIG. 4 is a schematic plan view showing a lead frame according to a second embodiment of the present invention.
Figure 5:
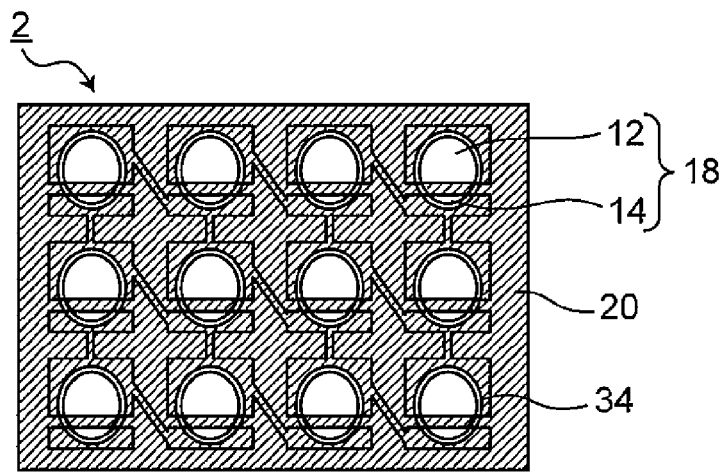
FIG. 5 is a schematic plan view showing the lead frame and a molded body in the second embodiment.
Figure 6:
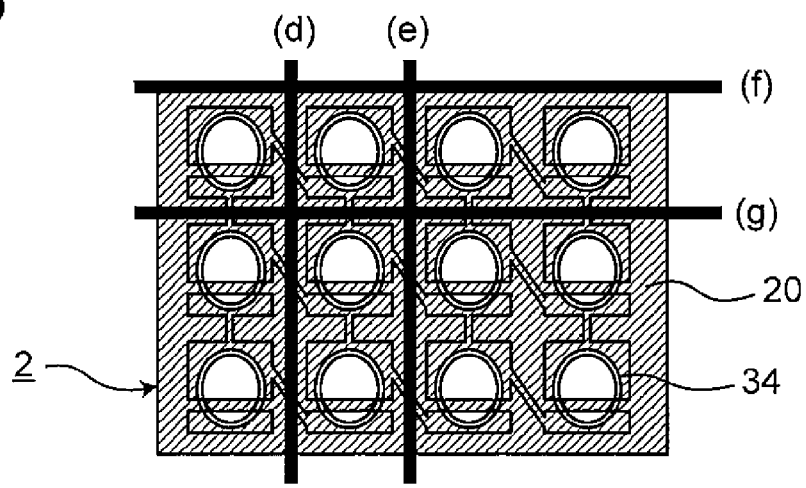
FIG. 6 is a schematic plan view showing the lead frame and the molded body in the second embodiment.
Figure 7:
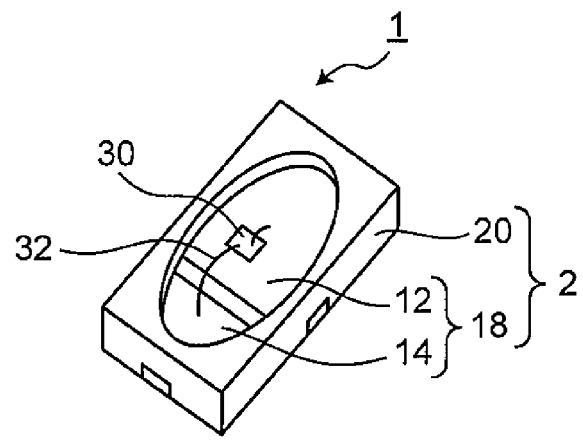
FIG. 7 is a schematic perspective diagram showing a light-emitting device in the second embodiment.

A light-emitting device according to a second embodiment of the present invention will be described below. FIG. 4 shows a schematic plan view of a lead frame in the second embodiment. FIG. 5 shows a schematic plan view of the lead frame and a molded body in the second embodiment. FIG. 6 shows another schematic plan view of the lead frame and the molded body in the second embodiment. FIG. 7 shows a schematic perspective diagram of the light-emitting device in the second embodiment.

In the package 2 in the second embodiment the first electrodes 12 and the second electrodes 14 are fixed with a molded body 20.

The first wiring 22 may be formed to have a linear shape and to connect the first electrode 12 to the second electrode 14. With this, the first wiring 22 may have a reduced length, so that the amount of the first wiring 22 in the lead frame 10 can be decreased, thus a cost of the material for manufacturing the light-emitting device can be reduced. Furthermore, the first wiring 22 having the linear shape can be connected to the adjacent electrode pairs 18 at the shortest distance, which can decrease an electric resistance of the first wiring 22, so that electric resistance of the light-emitting device in this embodiment can be reduced.

In the lead frame 10, the first wiring 22 may have any shape that includes a curved portion or a gently warped part.

The molded body 20 has one recess 34 for each set of electrode pair 18. At least a portion of a surface of each of the first and second electrodes 12 and 14 in one electrode pair 18 is exposed in the recess 34. The exposed parts of the electrode pair 18 in the package 2 may have any shape in the top view, such as a circular shape, an oval shape, or a polygonal shape.

The molded body 20 may be formed to cover the entire first and second wirings 22 and 24 in the electrode pairs 18, but is not limited thereto. For example, a plurality of molded bodies 20 spaced apart from each other may be formed to cover individual electrode pairs 18. The formation of the molded body 20 in such a shape can eliminate the necessity of cutting the molded body 20 or can decrease the volume of the molded body 20 to be cut when the package 2 is singulating into an appropriate shape. Thus, a singulation process of the package can be shortened, so that the production efficiency of the light-emitting device 1 can be improved. Further, the volume of the molded body 20 used in manufacturing the package 2 can be decreased, thus reducing the manufacturing cost of the light-emitting device 1.

The package 2 or the light-emitting device 1 may have any shape as long as it includes one or more electrode pairs 18.

Cutting an array of the packages 2 along the line (f) and the line (g) allows for obtaining the package 2 that includes four electrode pairs 18 located in the upper part of FIG. 6 and electrically connected together in the lateral direction. Cutting the array of the packages 2 along the line (d) allows for obtaining the package 2 that includes three electrode pairs 18 located in the left part of FIG. 6 and electrically connected together in the longitudinal direction. Cutting the array of the packages 2 along the line (g) and the line (e) allows for obtaining the package 2 that includes four electrode pairs 18 arranged in two rows and two columns located in the lower right part of FIG. 6 and electrically connected together. Cutting the array of the packages 2 along the line (g) and the line (d) allows for obtaining the package 2 that includes one electrode pair 18 located in the upper left part thereof.

Surfaces of the first electrode 12 or the second electrode 14 which is exposed in the recess 34 of the package 2 can serve as a mounting surface for the light-emitting element.

The light-emitting element 30 is mounted on the first electrode 12 (or second electrode 14) exposed in the recess 34 and then connected to the second electrode 14 (or first electrode 12) by a wire 32, which can produce the light-emitting device 1.

The light-emitting device 1 may have a light transmissive member made of encapsulating resin or the like that covers the light-emitting element 30. The light transmissive member can be provided to fill the recess 34 therewith. The light transmissive member may be provided to cover at least the light-emitting element 30, but is preferably formed to cover the upper surfaces of the first electrode 12 and second electrode 14 in the package 2. This arrangement can reduce corrosion of the first and second electrodes 12 and 14. The light transmissive member is preferably made of material that allows for light transmission of 60% or more of light emitted from the light-emitting element 30, more preferably 70% or more, even more preferably 80% or more, and most preferably 90% or more of the light. The light transmissive member preferably includes a wavelength conversion member, such as a phosphor. With this, the light-emitting device can be provided which emits light with a desired tone.

Figure 8:
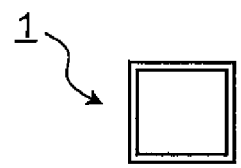
FIG. 8 is a schematic plan view showing one light-emitting device obtained after singulation in a first variant example.
Figure 9:
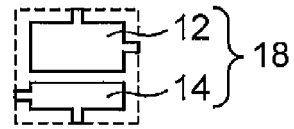
FIG. 9 is a schematic transparent view showing a lead frame for the one light-emitting device obtained after the singulation in the first variant example.

A light-emitting device in a first variant example will be described below. FIG. 8 shows a schematic plan view of one singulated light-emitting device in the first variation. FIG. 9 shows a schematic transparent view of a lead frame for the one singulated light-emitting device in the first variation.

A light-emitting device 1 in the first variation may comprise one electrode pair 18. For example, even after the package 2 with the plurality of electrode pairs 18 are singulated and cut into an appropriate shape, the light-emitting device 1 can be formed from only one electrode pair 18, which can efficiently make use of the package 2.

Although the light-emitting element 30 and the wire 32 are omitted in FIG. 9, actually, the first electrode 12 and the second electrode 14 are electrically connected via the light-emitting element 30 and the wire 32. The same goes for FIGS. 11, 13, and 15 described below.

Figure 10:
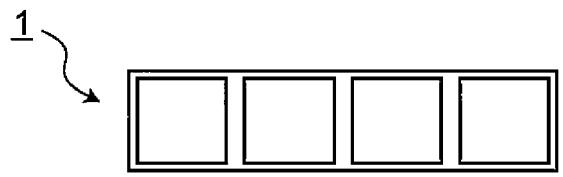
FIG. 10 is a schematic plan view showing four light-emitting devices arranged in the lateral direction after singulation in a second variant example.
Figure 11:
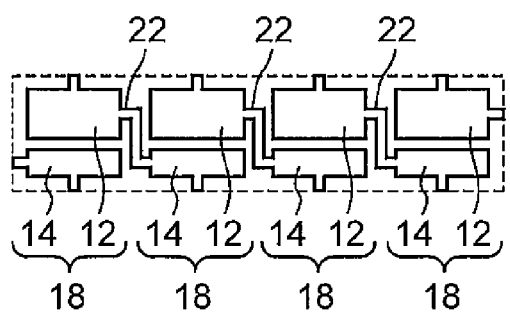
FIG. 11 is a schematic transparent view showing a lead frame for the four light-emitting devices arranged in the lateral direction after the singulation in the second variant example.

A light-emitting device in a second variant example will be described below. FIG. 10 shows a schematic plan view of four light-emitting devices arranged in the lateral direction after singulation in the second variant example. In other words, FIG. 10 is a schematic plan view of the light-emitting device 1 cut out to include four electrode pairs 18 such that the first electrodes 12 (or second electrodes 14) are arranged in the lateral direction, or adjacent to each other. FIG. 11 shows a schematic transparent view of a lead frame for the four light-emitting devices arranged in the lateral direction after the singulation in the second variation.

Even when an array of the lead frame 10 is singulated in the manner shown in the second variant example, the adjacent electrode pairs 18 are connected in series via the first wirings 22, so that the entire light-emitting device 1 can configure the series-connected circuit. Accordingly, a terminal of the first electrode 12 in the right-end side electrode pair 18 is electrically connected to a terminal of the second electrode 14 in the left-end side electrode pair 18, so that all the light-emitting elements included in the light-emitting device 1 can emit the light therefrom.

Even in the light-emitting device 1 obtained after singulation with five or more electrode pairs 18 arranged in the lateral direction, similarly, the terminal of the first electrode 12 in the right-end side electrode pair 18 is electrically connected to the terminal of the second electrode 14 in the left-end side electrode pair 18, so that all the light-emitting elements can emit the light.

Figure 12:
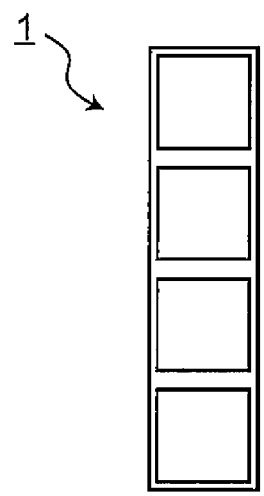
FIG. 12 is a schematic plan view showing four light-emitting devices arranged in the longitudinal direction after singulation in a third variant example.
Figure 13:
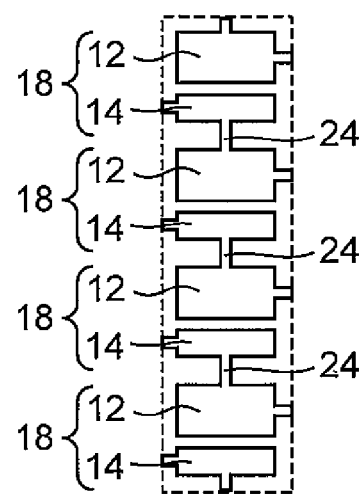
FIG. 13 is a schematic transparent view showing a lead frame for the four light-emitting devices arranged in the longitudinal direction after the singulation in the third variant example.

A light-emitting device in a third variant example will be described below. FIG. 12 shows a schematic plan view of four light-emitting devices arranged in the longitudinal direction after singulation in the third variant example. In other words, FIG. 12 is a plan view of the light-emitting device 1 cut out to include four electrode pairs 18 such that the first and second electrodes 12 and 14 are alternately arranged in the longitudinal direction, or adjacent to each other. FIG. 13 shows a schematic transparent view of a lead frame for the four light-emitting devices arranged in the longitudinal direction after the singulation in the third variation.

Even when the lead frame 10 is singulated in the manner shown in the third variant example, the adjacent electrode pairs 18 are connected in series via the second wirings 24, so that the entire light-emitting device 1 configures the series-connected circuit. With this, a terminal of the first electrode 12 in the upper-end side electrode pair 18 in FIG. 13 is electrically connected to a terminal of the second electrode 14 in the lower-end side electrode pair 18 in FIG. 13, so that all the light-emitting elements included in the light-emitting device 1 can emit the light therefrom.

Even in the light-emitting device 1 singulated to include five or more electrode pairs 18 arranged in the longitudinal direction, electrically connecting the terminal of the first electrode 12 in the upper-end electrode pair 18 is to the terminal of the second electrode 14 in the lower-end electrode pair 18 allows all the light-emitting elements included in the light-emitting device 1 to emit light.

Figure 14:
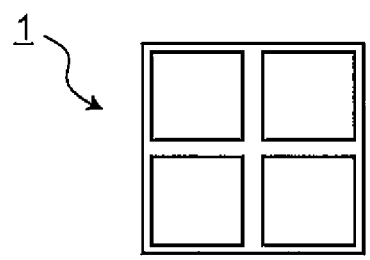
FIG. 14 is a schematic plan view showing two rows and two columns of light-emitting devices arranged in the longitudinal and lateral directions after singulation in a fourth variant example.
Figure 15:
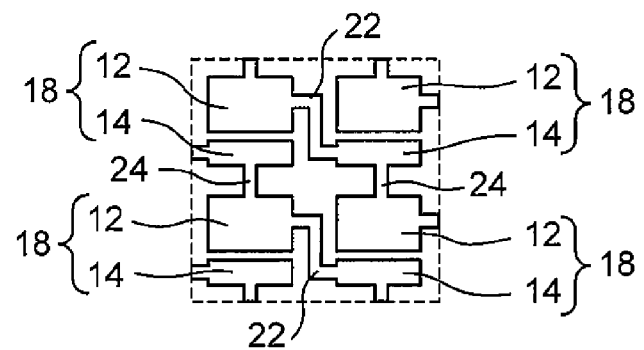
FIG. 15 is a schematic transparent view showing a lead frame for two rows and two columns of light-emitting devices arranged in the longitudinal and lateral directions after the singulation in the fourth variant example.

A light-emitting device in a fourth variant example will be described below. FIG. 14 shows a schematic plan view of the light-emitting device singulated with two rows and two columns of electrode pairs arranged in the longitudinal and lateral directions in the fourth variant example. In other words, FIG. 14 shows a schematic plan view of the light-emitting device 1 singulated in such a manner that two electrode pairs 18 are arranged in each of the longitudinal and lateral directions. FIG. 15 shows a schematic transparent view of the lead frame for two rows and two columns of light-emitting devices arranged in the longitudinal and lateral directions after singulation in the fourth variation.

In the case of singulating the lead frame 10 in the manner shown in the fourth variant example, the adjacent electrode pairs 18 are connected in series via the first wirings 22 or the second wirings 24, thus configuring the series-connected circuit in the entire light-emitting device 1. With this, a terminal of the first electrode 12 in the most upper-right electrode pair 18 is electrically connected to a terminal of the second electrode 14 in the lower-left electrode pair 18, so that all the light-emitting elements included in the light-emitting device 1 can emit the light therefrom.

In the light-emitting device 1 singulated with five or more in total of electrode pairs 18 arranged adjacent to each other in the longitudinal and lateral directions, electrically connecting the terminal of the first electrode 12 in the most upper-right electrode pair 18 to the terminal of the second electrode 14 in the most lower-left electrode pair 18 allows all the light-emitting elements included in the light-emitting device 1 to emit the light.

Figure 16:
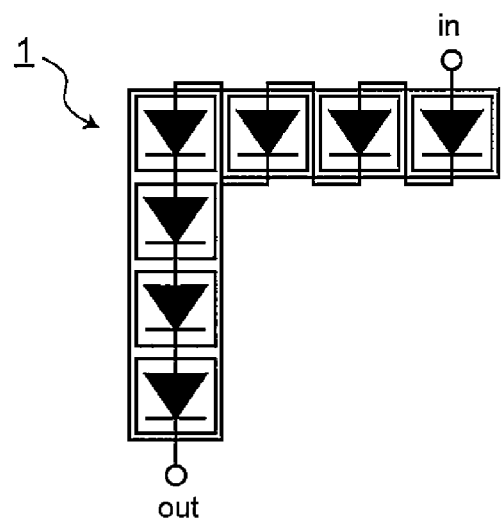
FIG. 16 is a schematic plan view showing singulated light-emitting devices in a fifth variant example.

A light-emitting device in a fifth variant example will be described below. FIG. 16 shows a schematic plan view of the light-emitting device obtained after singulation in the fifth variant example. Specifically, FIG. 16 is an equivalent circuit diagram of the light-emitting device 1 singulated in the L shape.

Connecting the plurality of sets of packages together in the longitudinal and lateral directions to form the L shape allows for configuring the series-connected circuit in the entire light-emitting device 1. With this, supplying current between the most upper-right package and the most lower-left package allows all the light-emitting elements included in the light-emitting device 1 to emit light.

Figure 17:
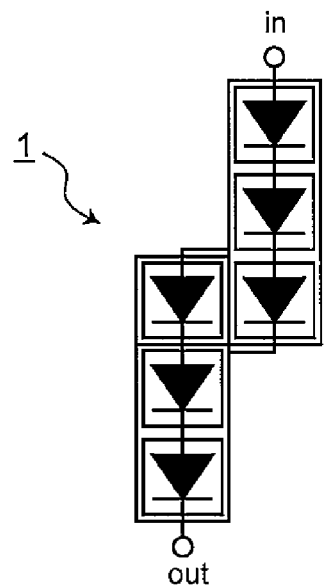
FIG. 17 is a schematic plan view showing singulated light-emitting devices in a sixth variant example.

A light-emitting device in a sixth variant example will be described below. FIG. 17 shows a schematic plan view of the light-emitting device according to the sixth variant example obtained after singulation. Specifically, FIG. 17 is an equivalent circuit diagram of the light-emitting device 1 singulated in a step-like manner.

Even in the case where the light-emitting device 1 is singulated in the step-like manner, like the sixth variant example, the entire light-emitting device 1 can configure the series-connected circuit. With this, supplying current between the most upper-right light-emitting device and the most lower-left light-emitting device in FIG. 17 allows all the light-emitting elements included in the light-emitting device 1 to emit light.

Main members included in the light-emitting device 1 will be described below.

The lead frame 10 is used as an example of the electrode pair.

Examples of the materials for the first electrode 12, the second electrode 14, the first wiring 22, and the second wiring 24 can include copper, nickel, palladium, tungsten, chromium, titanium, aluminum, silver, gold, iron, and an alloy thereof. In particular, the material for the electrode pair is preferably one that can reflect a light emitted from the light-emitting element. To improve the light reflectivity of the light emitting device, metal plating using silver, aluminum, copper, gold, etc. can be applied to the electrode pair, as needed.

The electrode pair can be, for example, a cured thermosetting resin with a metal wiring such as a wiring board made of a polyimide substrate, a glass epoxy substrate, or the like with a metal wiring, or a ceramic substrate with a metal wiring.

The molded body 20 may be formed using any known materials. For example, suitable material for the molded body 20 can be a thermoplastic resin, such as polyphthalamide, liquid crystal polymer, and polyimide, or a thermosetting resin, such as epoxy resin and silicone resin. Ceramic material can also be used for the molded body. In particular, the epoxy resin can be suitably used because of the excellent insulation, heat resistance, and light resistance as well as the good adhesion to the lead frame 10. Note that inorganic materials, such as glass or ceramics material, may be used as a base material of the molded body 20. The molded body 20 preferably has a light reflective property. The molded body 20 is preferably formed of the above-mentioned base material that contains light reflective material, for example, zinc oxide, titanium oxide, aluminum oxide, zirconium oxide, magnesium oxide, etc. Colorant or the like may be added to the molded body.

The light-emitting element 30 can be one selected from light-emitting elements having an appropriate wavelength, such as LED. For example, as a blue LED and a green LED, ZnSe, a nitride-based semiconductor ($In_xAl_yGa_{1-x-y}N$, $0 \leq x$, $0 \leq y$, $x+y \leq 1$), or GaP can be used. As a red LED can utilize GaAlAs, AlInGaP, and the like. Alternatively, any light-emitting element formed of other materials can be used. The composition, emission color, size and number or the like of the light-emitting elements can be selected according to a purpose as appropriate.

In the case of manufacturing a light-emitting device including phosphor, the nitride-based semiconductor, which can emit light with a short wavelength, so that the phosphor can effectively be activated. A variety of emission wavelengths can be selected depending on materials of a semiconductor layer and a mixed crystal ratio thereof.

The light-emitting element can be configured to output not only the light in the visible light region, but also ultraviolet rays or infrared rays. Further, a light-receiving element or the like can be mounted, in addition to the light-emitting element.

The wire 32 may be formed of various materials having electric conductivity, such as metal. Preferably, suitable metals for the wire 32 can include gold, silver, copper, aluminum, and an alloy thereof.

Examples of suitable materials for the light transmissive member can include, for example, an epoxy resin, a silicone resin, a polyimide resin, a polyphthalamide (PPA), a polycarbonate resin, a polyphenylene sulfide (PPS), a liquid crystal polymer (LCP), an ABS resin, a phenol resin, an acrylic resin, a PBT resin, or their modified resins, and a hybrid resin. In particular, a phenyl silicone resin is more preferable because it has high gas barrier properties and is less likely to cause sulfurization. Alternatively, the light transmissive member may be made of glass, a sintered body, and the like.

The light transmissive member may contain a phosphor. Thus, the light-emitting device 1 can be formed which emits light with a desired color tone. The phosphor may be contained in the light transmissive member, and additionally or alternatively, for example, the phosphor may be provided by forming a layer containing the phosphor on a light emission surface of the light-emitting element, or by applying the phosphor directly to the light emission surface of the light-emitting element.

Any known phosphor can be used in view of, for example, the wavelength of light emitted from a light source in use, the color of light to be exhibited, or the like. Specifically, suitable phosphors can include yttrium aluminum garnet (YAG) activated with cerium, the lutetium aluminum garnet (LAG) activated with cerium, nitrogen-containing calcium aluminosilicate activated with europium and/or chromium ($CaO-Al_2O_3-SiO_2$), silicates (($Sr, Ba)_2SiO_4$) activated with europium, β-sialon phosphor, and KSF based phosphor ($K_2SiF_6$: Mn). In particular, among them, the phosphor having the resistance to heat is preferably used.

Using such a phosphor can produce a light-emitting device that emits a mixed-color light of primary and secondary lights with visible wavelengths (for example, a white-based colored light), or a light-emitting device that emits a secondary light with a visible wavelength that is excited by a primary ultraviolet light. In particular, a phosphor that emits white light in combination with a blue light-emitting element is preferably a phosphor that exhibits a broad yellow light emission by being excited by the blue light.

A plurality of kinds of phosphors may be used in combination. For example, the phosphors described below are used in combination at a mixing ratio that achieves the desired color tone to adjust color rendering properties and color reproducibility as applications. For example, the phosphors can include $Si_{6-Z}Al_ZO_ZN_{8-Z}$: Eu, $Lu_3Al_5O_{12}$: Ce, $BaMgAl_{10}O_{17}$: Eu, $BaMgAl_{10}O_{17}$: Eu, Mn, (Zn, Cd) Zn: Cu, $(Sr, Ca)_{10}(PO_4)_6C_{12}$: Eu, Mn, $(Sr, Ca)_2Si_5N_8$: Eu, $CaAlSiB_xN_{3+x}$: Eu, $K_2SiF_6$: Mn, and $CaAlSiN_3$: Eu, and the like.

These phosphors may be used in the light transmissive member in combination. Alternatively, different phosphors may be contained in respective light transmissive members of a laminated structure.

A manufacturing method for the light-emitting device 1 in this embodiment includes the steps of:

providing wirings (hereinafter may be referred to as a wiring provision step); fixing the wires in a molded body 20 to form the package (hereinafter may be referred to as a package formation step); mounting the light-emitting element 30 on the package 2 (hereinafter may be referred to as a mounting step); and cutting the package 2 (hereinafter may be referred to as a singulation step). In the wiring provision step, wirings are formed in the manner described as below: a plurality of electrode pairs 18 are provided in which each pair includes a first electrode 12 on an upper side and a second electrode 14 on a lower side in the plan view of the electrode pairs; the first electrode 12 of at least one of the plurality of electrode pairs is electrically connected to the second electrode 14 included in an electrode pair 18 adjacent to a right side or a left side of the at least one of the electrode pairs 18; the second electrode 14 of the at least one electrode pair is electrically connected to the first electrode 12 included in an electrode pair 18 adjacent to a lower side of the at least one electrode pair; the first electrode 12 of the at least one electrode pair is not electrically connected to the first electrode 12 included in the electrode pair 18 adjacent to the right side or the left side of the at least one electrode pair; and the second electrode 14 of the at least one electrode pair is not electrically connected to the second electrode 14 included in the electrode pair 18 adjacent to the right side or the left side of the at least one electrode pair.

Each step will be described below.

The wirings in this embodiment can be formed by punching or etching a flat metal plate, or the like. Especially, the etching process is preferable because the first wiring 22 and the second wiring 24 can be easily formed from the flat metal plate.

Examples of the etching methods can include dry etching and wet etching. As an etchant, an appropriate material suitable for the material of the wire can be selected. Conditions for etching can be changed depending on the kinds or the like of metal that is to be etched.

For example, in the case where copper is used as a material for the lead frame, the appropriate etchant is a general soft etching solution for copper containing: persulfate or hydrogen peroxide, and inorganic acid; ferric chloride or copper chloride, and an inorganic acid; or an ammonia copper complex salt and an ammonium salt, or the like.

The wirings may be formed of the lead frame 10 itself.

Then, the wirings obtained in the previous step are fixed with the molded body 20 to form the package 2. A method for forming the package 2 may be any method known in the related art.

When the wirings are formed of the lead frame 10, the lead frame 10 may be gripped by a mold, and thermoplastic or thermosetting resin as the material for the molded body 20 may be charged into the mold, and solidified or cured to thereby fix the lead frame 10. Alternatively, ceramic may be injection-molded to fix the lead frame 10. Examples of molding methods can include, for example, transfer molding, compression molding, and extrusion molding.

Instead of using the lead frame 10, wirings may be formed on a ceramic green sheet, and the ceramic green sheet with the wirings formed thereon may be sintered to form the package 2.

In this process, for example, a plurality of electrode pairs, each pair including a first electrode and a second electrode made of copper or the like, may be formed on the ceramic green sheet made of alumina or aluminum nitride. A through hole is formed in the ceramic green sheet to establish conduction between the front and back sides of the ceramic green sheet therethrough. Subsequently, the ceramic green sheet with the plurality of electrode pairs is sintered. Then, plating is applied to the copper electrode pairs. Thereafter, in the same way as the case of using the above-mentioned lead frame, the light-emitting element can be mounted on the wirings and then the package is singulated, thus producing the light-emitting device.

Alternatively, instead of using the lead frame 10, the wirings may be formed on the cured thermosetting resin substrate to form the package 2.

In this process, for example, a plurality of electrode pairs, each pair including the first and second electrodes, are formed over the polyimide substrate or glass epoxy substrate having a flat plate-like shape. The light-emitting element is mounted on this one electrode pair to be sealed with the light transmissive resin, and then the package is singulated to produce the light-emitting device.

Alternatively, a wall made of thermosetting resin can also be provided on the polyimide substrate having flat plate-like shape or the like. The wall can be disposed between the adjacent electrode pairs. These walls and the flat-shaped polyimide substrate having flat plate-like shape or the like can form a recess with a part for mounting the light-emitting element thereon. After forming the walls in this way, the light-emitting element is mounted and sealed with the light transmissive resin, and then the walls are cut and the package is singulated to produce the light-emitting device.

The light-emitting element 30 is mounted on the first electrode 12 or the second electrode 14 included in the package 2 manufactured in this way. The light-emitting element 30 can be mounted on the first electrode 12 or second electrode 14 using an adhesive made of, for example, Ag paste. At this time, the light-emitting element 30 is mounted such that at least one of the positive and negative electrodes of the light-emitting element 30 is positioned on an upper surface side, i.e., on a side opposite to the mounting surface. Other than the Ag paste, a resin paste or a silicon paste may be used as the adhesive. Alternatively, eutectic bonding may be performed by using an Au—Sn alloy. After fixing the light-emitting element 30 to the first electrode 12 (or the second electrode 14), the electrode of the light-emitting element 30 is electrically connected to the second electrode (or the first electrode 12) using the wires 32.

In the present embodiment, a light transmissive member made of resin or the like containing the phosphor may be formed in the recess of the package 2 where the light-emitting element 30 are mounted and the wires 32 bonded. Thus, the light-emitting device 1 can be produced that emits light with a desired color tone.

The first wiring 22 and/or the second wiring 24 and the molded body 20 are cut by dicing, using a laser, or the like to singulate the light-emitting device 1. At this time, the singulation may be performed to produce the light-emitting device including one electrode pair 18, or to produce the light-emitting device including a plurality of electrode pairs 18.

The singulation step may be performed after mounting the light-emitting element in the package 2, but is not limited thereto. That is, the singulation step may be performed before mounting the light-emitting element 30 after fixing the lead frame 10 with the molded body 20 to form the package 2.

As mentioned above, the manufacturing method for the light-emitting device 1 according to embodiments of the present invention, the package 2 and the light-emitting device 1 in which a plurality of electrode pairs 18 is coupled together can be obtained to configure the series-connected circuit. Accordingly, this arrangement allows to form the package in which the plurality of sets of the light-emitting elements can be mounted at a high packing density, and the light-emitting device using the package.

The light-emitting device according to the embodiments of the present invention can be applied to various light-emitting devices, including a light source for illumination, light sources for various types of indicators, a light source for automobiles, a light source for a display, a light source for a liquid crystal backlight, a light source for a sensor, and a traffic light.

What is claimed is:

1. A package, comprising:
a plurality of electrode pairs, each electrode pair including a first electrode on an upper longitudinal side and a second electrode on a lower longitudinal side in a plan view, the plurality of electrode pairs arranged in a row and a column,
the first electrode of at least one of the plurality of electrode pairs is electrically connected to the second electrode included in an electrode pair adjacent to a first or second lateral side of the at least one of the plurality of electrode pairs; and
the second electrode of at least one of the plurality of electrode pairs is electrically connected to the first electrode included in an electrode pair adjacent to a lower longitudinal side of the at least one of the plurality of electrode pairs, wherein
the first electrode of the at least one electrode pair is not electrically connected to the first electrode included in the electrode pair adjacent to the first lateral side or the second lateral side of the at least one of the plurality of electrode pairs,
the second electrode of the at least one electrode pair is not electrically connected to the second electrode included in the electrode pair adjacent to the first lateral side or the second lateral side of the at least one of the plurality of electrode pairs,
the first electrode and the second electrode of the at least one electrode pair are fixed with a molded body, and
the molded body has substantially a rectangular outer shape.

2. The package according to claim 1, wherein the molded body is made of one of thermoplastic resin, thermosetting resin, and ceramic material.

3. The package according to claim 1, wherein the first electrode and the second electrode of the at least one electrode pair comprise of a lead frame.

4. The package according to claim 1, wherein the first electrode and the second electrode of the at least one electrode pair are wired at the molded body.

5. The package according to claim 1, wherein the first electrode and the second electrode of the at least one electrode pair are integrated with the molded body.

6. The package according to claim 1, wherein the molded body includes a light reflective member.

7. A light-emitting device, comprising:
the package according to claim 1; and
a light-emitting element mounted on the first electrode of the at least one electrode pair or on the second electrode of the at least one electrode pair.

* * * * *